United States Patent [19]

Arques

[11] Patent Number: 4,590,390

[45] Date of Patent: * May 20, 1986

[54] SOLID STATE PHOTONIC DETECTOR WITH CHARGE TRANSFER READER AND IMAGE-FORMING TARGET USING SUCH A DETECTOR

[75] Inventor: Marc Arques, Paris, France

[73] Assignee: Thomson-CSF, Paris, France

[*] Notice: The portion of the term of this patent subsequent to Nov. 19, 2002 has been disclaimed.

[21] Appl. No.: 391,485

[22] Filed: Jun. 24, 1982

[30] Foreign Application Priority Data

Jun. 30, 1981 [FR] France ............................. 81 12841

[51] Int. Cl.[4] .................. H01L 29/78; H03K 3/42
[52] U.S. Cl. ................................. 307/311; 357/24; 377/60
[58] Field of Search ............... 357/24, 30; 377/57-63; 307/311

[56] References Cited

U.S. PATENT DOCUMENTS

| 4,087,833 | 5/1978 | Tseng | 357/24 LR |
|---|---|---|---|
| 4,112,316 | 9/1978 | Wentz | 357/24 LR |
| 4,150,304 | 4/1979 | Jensen | 357/24 R |
| 4,316,103 | 2/1982 | Nathanson | 357/24 LR |
| 4,443,885 | 4/1984 | van Roermund | 377/57 |

OTHER PUBLICATIONS

IEEE Journal of Solid-State Circuits, vol. SC-13, No. 1, Feb. 1978, IEEE New York, J. T. Longo et al.: "Infrared Focal Planes in Intrinsic Semiconductors", pp. 139-158.

IEEE Transactions on Electron Devices, vol. ED-27, No. 1, Jan. 1980, IEEE New York, P. Felix et al.: "CCD Readout of Infrared Hybrid Focal-Plane Arrays", pp. 175-188.

Primary Examiner—Gene M. Munson
Attorney, Agent, or Firm—Roland Plottel

[57] ABSTRACT

A charge transfer readout device and a photovoltaic diode input in which the charges involved in the readout device have the opposite sign to those of the signal from the diode. The invention provides for adding to the diode signal a current of the opposite sign of sufficient quantity that the resultant is of the sign involved in the readout device. This current is supplied by an MOS transistor formed on the substrate of the readout device and includes a P doped zone, which is separated from another P doped zone to which the signal from the diode is applied through an electrode.

4 Claims, 15 Drawing Figures

FIG_1-a 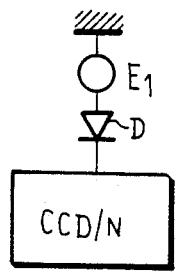
FIG_1-b 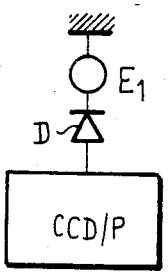
FIG_2-a 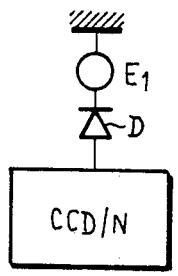
FIG_2-b 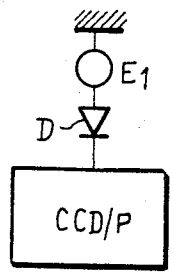
FIG_3-a 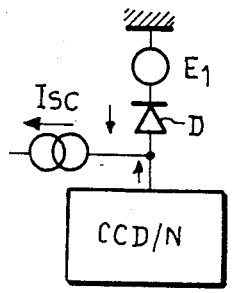
FIG_3-b 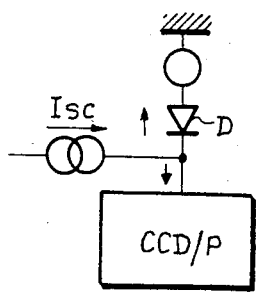
FIG_4 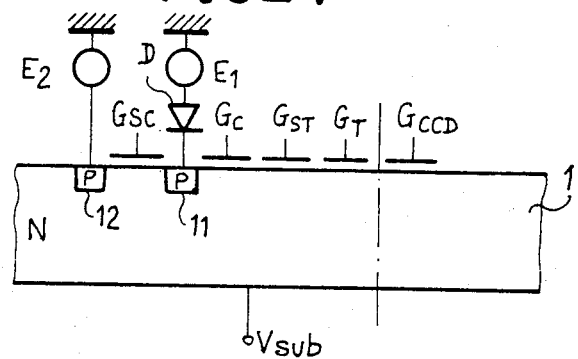

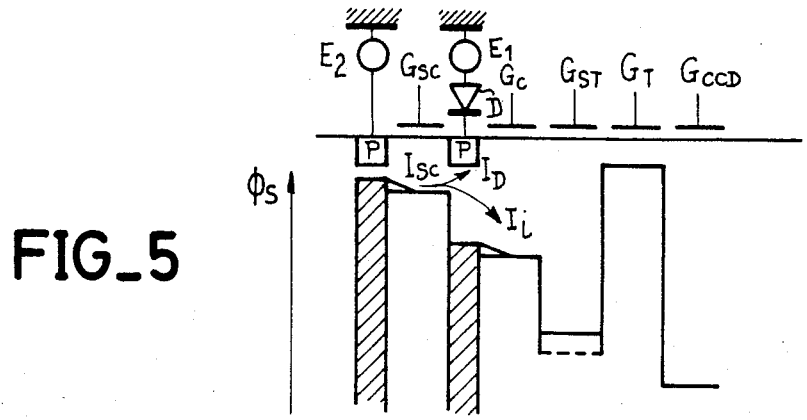
FIG_5
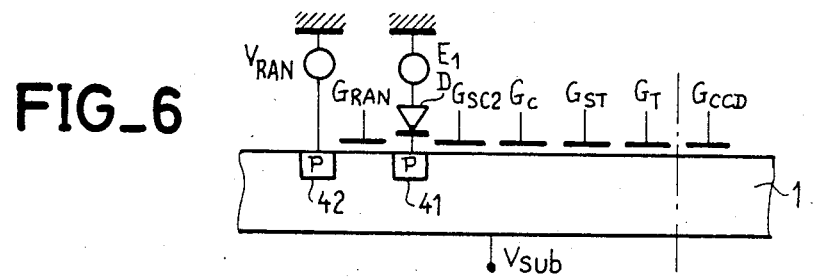
FIG_6
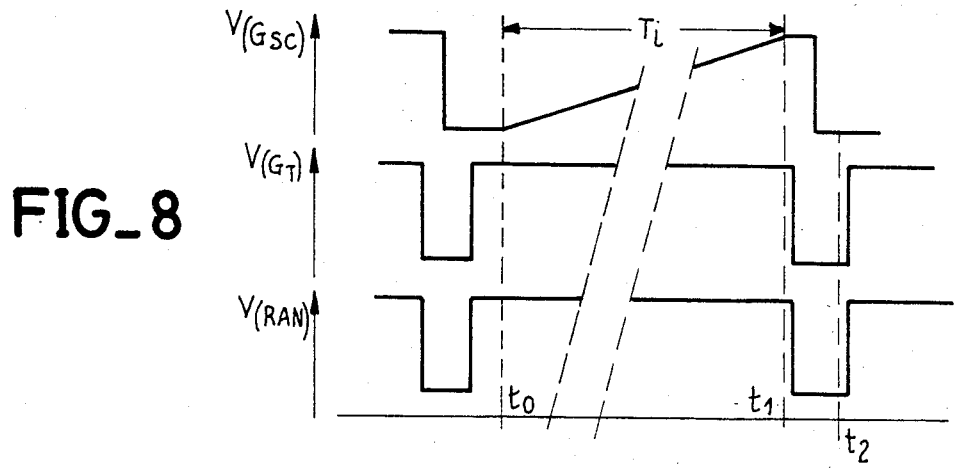
FIG_8
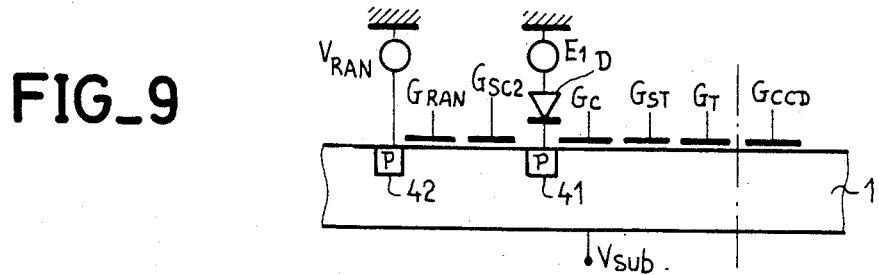
FIG_9

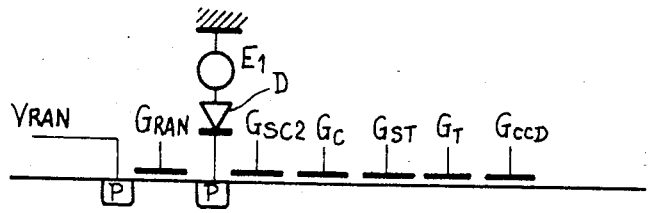
FIG_7-a  $t=t_0$
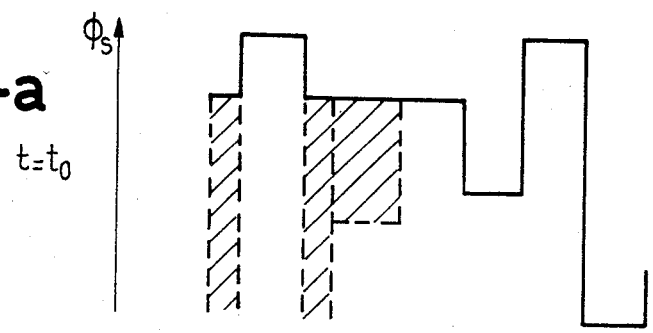
FIG_7-b
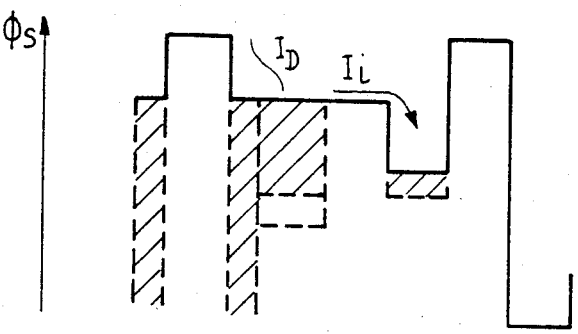
FIG_7-c  $t=t_1$
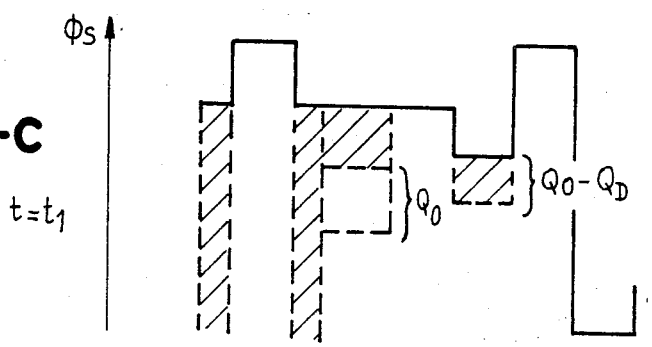
FIG_7-d  $t=t_2$

SOLID STATE PHOTONIC DETECTOR WITH CHARGE TRANSFER READER AND IMAGE-FORMING TARGET USING SUCH A DETECTOR

BACKGROUND OF THE INVENTION

The invention relates to radiation detectors and to radiation detectors having charge transfer readout devices.

Such a detector is used for forming images of incident radiation and especially infra-red radiation.

The invention relates in particular to assemblies in which the detectors or sensors are photovoltaic diodes or photodiodes, and the readout devices are charge transfer devices, such as charge-coupled devices (CCD). In the CCD, the signal to be read is transferred step by step to the reading register. The signal is the free charges generated in the diode by the radiation received. The invention will be described in a non-limiting way in the case of such diodes.

This application is related to applicant's co-pending application Ser. No. 389,288 filed on the same date as this application and having a common assignee.

SUMMARY OF THE INVENTION

Generally, in such assemblies, the signal from the photodiode, and those used in the charge transfer device are of the same sign. However, it may happen, for technological reasons, that the situation is reversed, and that these signals are of opposite signs or opposite charges. A problem then arises for reading the signal; and it is to the solution of this problem that the invention is devoted.

BRIEF DESCRIPTION OF THE DRAWINGS

The invention will be better understood by referring to the following description and the accompanying figures in which:

FIGS. 1(a), 1(b), 2(a) and 2(b) are diagrams showing the different situations met in the assemblies to which the invention applies;

FIGS. 3(a) and 3(b) are diagrams similar to those of FIGS. 2(a) and 2(b) but modified by the invention;

FIGS. 4 and 5 are schematical views of a first variation of the invention, and a diagram of the potentials relating thereto, respectively;

FIGS. 6 and 7(a) through 7(d) are potential diagrams of variation of the invention;

FIG. 8 is a diagram complementary to that of FIG. 7; and

FIG. 9 is a schematical view of the modified version of the embodiments of FIG. 6.

DESCRIPTION OF THE PREFERRED EMBODIMENTS

FIGS. 1(a), 1(b), 2(a) and 2(b) schematically show, in a conventional way, a diode D and a DC supply E1. This diode is a photovoltaic diode, and supplies an electric signal which corresponds to incident photons. A charge transfer reader or readout device CCD is represented by a rectangle. The rectangle is marked with the letters CCD and an additional letter indicating the type of the transfer charges, i.e., N for electrons and P for "holes". In FIGS. 1, the photodiode (connected as shown) signal has charges of the same type as those used in the transfer, i.e., electrons in FIG. 1(a); and "holes" in FIGS. 1(b). In FIG. 2 it is the reverse:—the charges of the signal and those of the transfer are of opposite type. This is shown in the drawings of FIGS. 2(a) and 2(b) compared with those of FIGS. 1(a) and 1(b). The invention applies to the situations of FIGS. 2. For example, with a type of transfer charges which are negative (electrons), or positive ("holes"). The FIG. 2 situations occur because the photodiode and the readout device CCD are normally made from two different materials. The charge transfer reader CCD uses, for example, an N type (channel) silicon substrate, in which the transfer charges are electrons, and the photodiode, for example, has an indium antimonide InSb. substrate, which is especially useful for infra-red operation. Furthermore (because of essentially technological restrictions) it may be impossible to get access to one of the terminals of the photodiode (anode of cathode) which is to make connection with the charge transfer device CCD. The other terminal is connected to the voltage source. This could happen in FIG. 2(a) or FIG. 2(b) if, for special reasons, a P type channel was chosen.

To resolve this problem, it is known to add a current source $I_{SC}$, as shown in FIGS. 3(a) and 3(b). For these current sources, the directions of the currents involved are indicated by arrows (in accordance with the usual conventions in electricity), where the direction of the current is opposite to that of the movement of the electrons. The additional current supplied by this source is designated by $I_{SC}$. To solve the difficulty referred to, this current $I_{SC}$ must be greater, in absolute value, than the original photo generated current which flows from the photodiode, so that carriers are injected into the readout device CCD, and which have the same sign as those which have conduction therein. The current read, in this case, is a complementary current, of the form $a-s$, where "s" is the signal current from the photodiode and "a" is the total current supplied by the source during an integration period. This current $a-s$ is just as representative of the signal as the current "s" itself. The current source is outside the charge transfer readout device CCD.

According to the invention, in order to increase the integration, the current source is formed on the same substrate as the charge transfer readout device.

In a first variation of the invention, as shown in FIG. 4, the current source is an MOS transistor formed in the substrate 1 and includes the P doped zone 11 connected to a voltage source $E_1$, the gate electrode and P-type zone 12. The subscript SC has been chosen to illustrate the relationship of this gate with the current source.

In this case, the charges transferred are "holes," i.e., positive charges. The assembly has a P type channel, and corresponds to the embodiment shown in FIG. 3(b).

The substrate is biassed to voltage $V_{sub}$.

FIG. 4 also shows the elements of the coupling elements (as they usually appear) arranged between the photodiode output and the input of the charge transfer device, shown by its first electrode $G_{CCD}$. This stage essentially is an MOS transistor, whose source is P doped zone 11 connected to the photodiode, and whose control electrode is a gate $G_C$; and whose drain is formed by the potential well formed under storage electrode $G_{ST}$, under which are stored the signal charges before injection thereof into the charge transfer device, beyond the broken line.

The current source transistor is, maintained in a saturation condition, and the current of this source is the current $I_{SC}$ of FIG. 3. The photodiode takes a part $I_D$ of this current to compensate for the charges which have a sign opposite to those of the transfer charges in the readout device. There remains the current $I_i$ given by the formula:

$$I_i = I_{SC} - I_D \quad (1)$$

which is the distribution of the currents in FIG. 3. Current $I_i$ is formed by charges having the desired sign for this transfer. The saturation condition of the current source transistor avoids fluctuations in the output of the transistor $P-G_{SC}-P$, due to the current which might be received from the photodiode.

The current $I_i$ is stored in the drain formed under electrode $G_{ST}$ and is integrated under this electrode during the whole integration period. The resulting charge is periodically transferred to the readout device by enabling a channel under transfer electrode $G_T$.

FIG. 5 shows the surface potentials $\phi_S$ under the different electrodes during the transfer of charges of current $I_i$ under the storage electrode $G_{ST}$.

In FIG. 5, the continuous lines represent the surface potentials effectively reigning under the different electrodes; and the broken lines represent what these same potentials would be if the "potential wells" (in accordance with the usual terminology in the matter) were empty of charges. The hatched surfaces show the quantities of charges present in the wells. Finally, for the sake of clarity, the different electrodes have been shown without overlapping therebetween. In fact, two successive electrodes may partially overlap. Also (and for the same reason) the insulating layer separating the substrate from the different electrodes has not been shown. The axis of the potentials $\phi_S$ is orientated positively upwards in the figure, in keeping with the fact that the substrate is a P channel substrate and the mobile charges are "holes."

It will be noted that,—considering the form of the magnitude of the signal used, a−s or $I_i$ according to formula (1), in the device of the invention—the larger the magnitude of the signal from the photodiode, the smaller the magnitude of the signal injected into the readout device. Thus there is in the device of the invention a self-compensating effect for overloads, such as that resulting from over-illumination of the photodiode for example.

The signal injected into the readout device may even become zero when the current $I_D$ becomes sufficiently great to cancel out the right-hand side of equation (1). For any illumination of the photodiode corresponding to this value, or greater, the signal read is chopped at the output of the charge transfer device and there is no glare in any case.

It will also be noted that the presence of the current $I_{SC}$, when it is sufficiently high, improves the transmission conditions of the signal from the photodiode into the charge transfer reader. It is in fact known that injection efficiency of this signal depends on the relative values of the impedances of the photodiode and of the MOS stage. At low frequency, it increases with the transconductance of the MOS transition. For a given resistance of the photodiode, the transconductance is itself an increasing function of the current involved in the transmission of the signal, namely the preceding current $I_i$. Also, as previously explained, depending on the choice made of the signal magnitude, the injection efficiency is better than the illumination level, i.e., when the quantity $I_D$ in formula (1) is low.

Thus poorly illuminated scenes are transmitted better than highly illuminated scenes.

In the embodiment of FIG. 6, the current source transistor is formed between P-zones 41 and 42 and its releveling gate electrode is $G_{RAN}$. Zone 41 is supplied by the output of photodiode D and zone 42 is connected to a voltage source $V_{RAN}$. The coupling transistor between the photodiode and the CCD is modified by the inclusion of an auxiliary electrode $G_{SC2}$ between its source 41 and its gate electrode $G_C$.

The operation of this embodiment will be explained by reference to FIGS. 7(a) through 7(d).

First the current source transistor formed between zones 41 and 42 is biased for linear operating conditions during its active phase and is disabled the rest of the time. Moreover, the electrode $G_{SC1}$ is operated as indicated in FIGS. 7 to create thereunder a variable potential well which fills with charges injected by zone 41.

After disabling the channel under gate $G_{RAN}$ at the initial time $t=t_0$ (FIG. 7(a)), the capacity of the potential well under $G_{SC2}$ is reduced by reducing the potential applied to $G_{SC2}$ (FIG. 7(b)). The charge surplus in the well under $G_{SC2}$ causes a current to flow into the well under storage electrode $G_{ST}$, which current, as in the preceding example, is equal to $I_{SC}$ reduced by the current $I_D$ absorbed by the photodiode in accordance with formula (1). When the capacity of the well under gate $G_{SC2}$ is at its minimum value at $t=t_1$, separated from time $t_0$, possibly, by the duration of the integration period $T_i$, as will be seen, the situation shown in FIG. 7(c) occurs. Then, as indicated by FIG. 7(d), well under gate $G_{SC2}$ is brought back to its initial depth and it is again filled, by enabling the channel under gate $G_{RAN}$ at time $t=t_2$. The device is ready for the next cycle. The letters $Q_o$ and $Q_D$ designate in the diagram of FIG. 7 the charge quantities resulting during the cycle of the preceding currents $I_{SC}$ and $I_D$.

A comparison between the two embodiments show, in both cases, that there is current creation by a suitably biassed MOS formed in the substrate of the readout device, (a) in the embodiment of FIG. 4, this current flows continuously to the storage electrode $G_{ST}$, from which the charges are then transferred to the readout device; whereas (b), in the embodiment of FIG. 6, on the contrary, there is a first storage of the charges under gate $G_{SC2}$ before storage under electrode $G_{ST}$, and the result of this first storage is used to supply electrode $G_{ST}$ which then functions as in the preceding case.

The transfer of the charges under electrode $G_{ST}$ may take place in different ways within the scope of the invention. In a preferred embodiment, it takes place by application through electrode $G_{SC2}$ of a voltage steadily decreasing in time, in accordance with the diagram of FIG. 8. This forms the subject matter of the previously identified copending application. This figure also shows the voltages applied during one cycle to a transfer electrode $G_T$ in the readout device and the re-levelling electrode $G_{RAN}$. In the example of this figure, the voltage ramp applied to electrode $G_{SC2}$ corresponds to the free charges consisting of "holes" as in the preceding. The timing diagram of FIG. 8 has been cut so as to respect the proportions of the different phases, interval $t_1 t_2$ being in general a small fraction of $T_i$, for example, of the order of a tenth or less. The current $I_{SC}$ is controlled by acting on the slope of the preceding ramp.

The injection of the charges stored under electrode $G_{ST}$ into the readout device, controlled by transfer electrode $G_T$, takes place periodically at a frequency which determines the integration period $T_i$ (which has been discussed). This frequency is in general very much less than that at which the readout device is itself emptied of its information. This is because, very often, only one register is available for reading, one after the other, the signals coming from several photodiodes which are all injected at the same time; and into the readout device, at the end of each integration period. As for the frequency at which the transfer of the charges takes place from gate $G_{SC2}$ under $G_{ST}$ in the described cycle, it may be very different from the frequency at which $G_T$ is controlled. If the capacity of the well under $G_{SC2}$ is smaller than that of the well under $G_{ST}$, the transfer from $G_{SC2}$ to $G_{ST}$ may be repeated several times before emptying the well under $G_{St}$. The frequency of acting on $G_{SC2}$ may then be greater than that for acting on $G_T$, and conversely, it may be less, when it is the capacity under $G_{SC2}$ which is greater than that under $G_{ST}$. There is no relationship imposed between these frequencies. In the case of FIG. 7, they have been chosen equal; the transfer into the reader is effected at time $t_2$.

The frequencies for switching the potentials of the electrodes $G_{RAN}$ and $G_{SC2}$ are always equal.

The preceding remarks, concerning the self-protection against overloads, and the favorable effect of the current $I_{SC}$ on the injection efficiency, apply to the case of this embodiment.

It will be noted that there is a difference between the two variations insofar as the lag following over-illumination is concerned. In the case of the first variation, a lag can be observed due to the time required for the diode to come back to its operating point, which was moved under the effect of this overload, to a value such that the current $I_D$ is reduced until it becomes equal to $I_{SC}$. This movement takes place towards the open circuit operating point of the photodiode; which is therefore not exposed to any damage because of this over-illumination. In the case of the second variation, such a lag does not exist, for the operating point of the diode is re-adjusted at the beginning of each cycle.

In a variation of the preceding arrangement shown in FIG. 9, auxiliary electrode $G_{SC2}$ is placed between the two P diffusions of the current source transistor, after the gate $G_{RAN}$.

Material for the charge transfer readout device, besides silicon, which has already been mentioned, may include gallium arsenide.

The photodiode may be made from, besides indium antimonide, mercury cadmium telluride, HgCdTe, and lead tin telluride, PbSnTe, for infra-reds with a wavelength between 3 and 12 microns.

In the embodiments of the invention, the tellurides are associated with P channel charge transfer device, and indium antimonide with N channel charge transfer devices.

The invention is easy to manufacture; the additional elements required can be easily integrated in the substrate of the charge transfer reader.

It finds an application in infra-red image formation for constructing targets comprising an array of photodiodes disposed along strips or at the surface of a mosaic.

The invention has been described in the case of an N type substrate, with P type channel, corresponding to FIG. 3(b). It goes without saying that it applies equally to the case of FIG. 3(a), with an N type channel, providing the necessary changes are made which are accessible to a man skilled in the art.

What is claimed is:

1. A solid state photon detector with a charge transfer readout device, a signal from the detector being injected in the form of charges into the readout device through a first MOS transistor, said MOS transistor having a source connected to the detector, a control gate and an electrode forming a drain; transfer charges created in the readout device being of the opposite sign to those of the signal; comprising means for generating a current formed of charges having the same sign as the transfer charges, and means for injecting this current into said transistor, wherein the means for generating a current being formed on the same substrate as the readout device and comprising a second MOS transistor conveniently biased and located side by side with the first MOS transistor, wherein the second MOS transistor is formed by a first P doped zone in the substrate to which the detector is connected and which constitutes the source of the first transistor, a second P doped zone formed in this substrate and a first gate disposed between two said zones, and means for biasing, during operation, said second transistor alternately under linear and disabled operating conditions, and a second gate on the substrate, and means for applying, during operation, to said second gate a ramp voltage at least once during a time interval which separates two successive transfers of the signal, from a transition of signal to the readout device.

2. The photon detector as claimed in claim 1, wherein said second gate is beside said first gate between said two P zones.

3. The photon detector as claimed in claim 1, wherein said second gate is on the other side of said first gate with respect to said second P zone.

4. The photon detector as claimed in claim 1, wherein said voltage ramp is linearly variable.

* * * * *